(12) United States Patent
Mizuno et al.

(10) Patent No.: US 7,808,748 B2
(45) Date of Patent: Oct. 5, 2010

(54) MAGNETORESISTIVE ELEMENT INCLUDING HEUSLER ALLOY LAYER

(75) Inventors: Tomohito Mizuno, Tokyo (JP); Yoshihiro Tsuchiya, Tokyo (JP); Keita Kawamori, Tokyo (JP)

(73) Assignee: TDK Corporation, Tokyo (JP)

( * ) Notice: Subject to any disclaimer, the term of this patent is extended or adjusted under 35 U.S.C. 154(b) by 896 days.

(21) Appl. No.: 11/709,148

(22) Filed: Feb. 22, 2007

(65) Prior Publication Data
US 2007/0230070 A1    Oct. 4, 2007

(30) Foreign Application Priority Data
Mar. 31, 2006  (JP)  ............... 2006-096310

(51) Int. Cl.
*G11B 5/48*  (2006.01)
(52) U.S. Cl. .................................. 360/324.1
(58) Field of Classification Search ............ 360/324.12, 360/324.11, 324.1, 324.2; 29/603.07
See application file for complete search history.

(56) References Cited

U.S. PATENT DOCUMENTS

| 7,336,453 | B2* | 2/2008 | Hasegawa et al. ...... 360/324.12 |
| 2003/0137785 | A1 | 7/2003 | Saito |
| 2005/0266274 | A1 | 12/2005 | Hasegawa et al. |
| 2006/0044703 | A1 | 3/2006 | Inomata et al. |
| 2006/0215330 | A1* | 9/2006 | Ide et al. .................. 360/324.1 |
| 2007/0291422 | A1* | 12/2007 | Tsuchiya et al. ....... 360/324.11 |
| 2008/0268290 | A1* | 10/2008 | Carey et al. .............. 428/811.2 |

FOREIGN PATENT DOCUMENTS

| JP | A-2003-218428 | 7/2003 |
| JP | A-2004-221526 | 8/2004 |
| JP | A 2005-019484 | 1/2005 |
| JP | A-2005-228998 | 8/2005 |
| JP | A 2005-0347418 | 12/2005 |

OTHER PUBLICATIONS

Y. Sakuraba et al., "Magnetic tunnel junctions using B2-ordered $Co_2MnAl$ Heusler alloy epitaxial electrode", Applied Physics Letters, vol. 88, pp. 022503-1 to 022503-3 (Jan. 2006).

(Continued)

*Primary Examiner*—Allen T Cao
(74) *Attorney, Agent, or Firm*—Oliff & Berridge, PLC

(57) ABSTRACT

A pinned layer of an MR element includes an underlying magnetic layer made of a magnetic alloy layer having a body-centered cubic structure, and a Heusler alloy layer formed on the underlying magnetic layer. A free layer of the MR element includes an underlying magnetic layer made of a magnetic alloy layer having a body-centered cubic structure, and a Heusler alloy layer formed on the underlying magnetic layer. Each of these two Heusler alloy layers is made of a CoMnSi alloy having an Mn content higher than 25 atomic percent and lower than or equal to 40 atomic percent, and contains a principal component having a B2 structure in which Co atoms are placed at body-centered positions of unit cells and Mn atoms or Si atoms are randomly placed at vertexes of the unit cells.

14 Claims, 8 Drawing Sheets

OTHER PUBLICATIONS

Hua Wu et al., "First-principles study of thin magnetic transition-metal silicide films on Si(001)", Physical Review B, vol. 72, pp. 144425-1 to 144425-12 (Oct. 2005).

S. Javad Hashemifar et al., "Preserving the Half-Metallicity at the Heusler Alloy $Co_2MnSi(001)$ Surface: A Density Functional Theory Study", Physical Review Letters, vol. 94, pp. 096402-1 to 096402-4 (Mar. 2005).

A.S. Manea et al., "Heusler bulk materials as targets for pulsed laser deposition: growth and characterization", Journal of Crystal Growth, vol. 275, pp. e1787-e1792 (Dec. 2004).

* cited by examiner

MAGNETORESISTIVE ELEMENT INCLUDING HEUSLER ALLOY LAYER

BACKGROUND OF THE INVENTION

1. Field of the Invention

The present invention relates to a magnetoresistive element and a method of manufacturing the same and to a thin-film magnetic head, a head gimbal assembly, a head arm assembly and a magnetic disk drive each of which incorporates the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write (recording) head having an induction-type electromagnetic transducer for writing and a read (reproducing) head having a magnetoresistive (MR) element for reading are stacked on a substrate.

MR elements include giant magnetoresistive (GMR) elements utilizing a giant magnetoresistive effect, and tunnel magnetoresistive (TMR) elements utilizing a tunnel magnetoresistive effect.

It is required that the characteristics of a read head include high sensitivity and high output capability. GMR heads incorporating spin-valve GMR elements have been mass-produced as read heads that satisfy such requirements. Recently, developments have been made for read heads using TMR elements to adapt to further improvements in areal recording density.

Typically, a spin-valve GMR element incorporates: a nonmagnetic conductive layer having two surfaces facing toward opposite directions; a free layer disposed adjacent to one of the surfaces of the nonmagnetic conductive layer; a pinned layer disposed adjacent to the other of the surfaces of the nonmagnetic conductive layer; and an antiferromagnetic layer disposed adjacent to one of the surfaces of the pinned layer farther from the nonmagnetic conductive layer. The free layer is a ferromagnetic layer in which the direction of magnetization changes in response to a signal magnetic field. The pinned layer is a ferromagnetic layer in which the direction of magnetization is fixed. The antiferromagnetic layer is a layer that fixes the direction of magnetization in the pinned layer by means of exchange coupling with the pinned layer.

Conventional GMR heads have a structure in which a current used for detecting magnetic signals (that is hereinafter called a sense current) is fed in the direction parallel to a plane of each layer making up the GMR element. Such a structure is called a current-in-plane (CIP) structure. On the other hand, developments have been made for another type of GMR heads each having a structure in which a sense current is fed in the direction intersecting a plane of each layer making up the GMR element, such as the direction perpendicular to a plane of each layer making up the GMR element. Such a structure is called a current-perpendicular-to-plane (CPP) structure. A GMR element used for read heads having the CPP structure is hereinafter called a CPP-GMR element. A GMR element used for read heads having the CIP structure is hereinafter called a CIP-GMR element.

A read head incorporating the TMR element mentioned above has the CPP structure, too. Typically, a TMR element incorporates: a tunnel barrier layer having two surfaces facing toward opposite directions; a free layer disposed adjacent to one of the surfaces of the tunnel barrier layer; a pinned layer disposed adjacent to the other of the surfaces of the tunnel barrier layer; and an antiferromagnetic layer disposed adjacent to one of the surfaces of the pinned layer farther from the tunnel barrier layer. The tunnel barrier layer is a nonmagnetic insulating layer that allows electrons to pass therethrough while maintaining the spin by means of the tunnel effect. The free layer, the pinned layer and the antiferromagnetic layer of the TMR element are the same as those of a spin-valve GMR element.

For a conventional CPP-GMR element, a CoFe alloy and an NiFe alloy have been mostly used as the material of the pinned layer and the free layer. In such a conventional CPP-GMR element, with regard to the configuration of layers capable of achieving a practical read gap length, the magnetoresistance change ratio (hereinafter called an MR ratio), which is a ratio of magnetoresistance change with respect to the resistance, is not more than approximately four percent and therefore is not sufficient in practice.

It is assumed that the reason why the MR ratio of the above-mentioned conventional CPP-GMR element is low is that the spin polarization of the CoFe alloy or the NiFe alloy used as the material of the pinned layer and the free layer is small.

To increase the MR ratio, it has been proposed recently to employ CPP-GMR elements in which a half metal whose spin polarization is nearly 1 is used as the material of the pinned layer and/or the free layer. JP 2003-218428A, JP 2004-221526A and JP 2005-228998A disclose CPP-GMR elements in which a Heusler alloy that is a type of half metal is used as the material of the pinned layer and/or the free layer.

For TMR elements, it is also expected that a high MR ratio will be achieved by employing a half metal as the material of the pinned layer and/or the free layer. JP 2004-221526A and JP 2005-228998A disclose TMR elements in which a Heusler alloy is used as the material of the pinned layer and/or the free layer.

JP 2003-218428A discloses a structure in which magnetic layers made of a magnetic material that is any of a CoFe alloy, a CoFeNi alloy, an NiFe alloy, and Co are respectively disposed on the top and bottom of a Heusler alloy layer in a pinned layer, and magnetic layers made of a magnetic material that is any of a CoFe alloy, a CoFeNi alloy, and Co are respectively disposed on the top and bottom of a Heusler alloy layer in a free layer.

Heusler alloy will now be briefly described. Heusler alloy is a term generally used for ordered alloys having a chemical composition of XYZ or $X_2YZ$. An ordered alloy having a chemical composition of XYZ is called a half Heusler alloy. An ordered alloy having a chemical composition of $X_2YZ$ is called a full Heusler alloy. Here, X is an element selected from the group consisting of the transition metals of the Fe family, the Co family, the Ni family and the Cu family of the periodic table, and the noble metals. Y is at least one element selected from the group consisting of Fe and the transition metals of the Ti family, the V family, the Cr family and the Mn family of the periodic table. Z is at least one element selected from the group consisting of the typical elements of the periods from the third to fifth periods inclusive of the periodic table.

One type of Heusler alloys is a CoMnSi alloy. According to the stoichiometric composition of the CoMnSi alloy as a full Heusler alloy, Co, Mn and Si are in the proportion of 2:1:1. It was expected that the MR ratio of a CPP-GMR element would be greatly increased by employing a CoMnSi alloy layer having such a proportion of the elements as the pinned layer and/or the free layer of the CPP-GMR element.

Then, a CPP-GMR element was actually fabricated using CoMnSi alloy layers in which Co, Mn and Si were in the proportion of 2:1:1 as the pinned layer and the free layer. The alloy layers were respectively formed on magnetic layers as disclosed in JP 2003-218428A. The MR ratio of the CPP-GMR element thus fabricated was not more than approximately 5 percent, which was contrary to the expectation.

OBJECT AND SUMMARY OF THE INVENTION

It is an object of the invention to provide a magnetoresistive element in which a current is fed in a direction intersecting a plane of each layer making up the magnetoresistive element, the magnetoresistive element having a great magnetoresistance change ratio, and to provide a method of manufacturing such a magnetoresistive element, and a thin-film magnetic head, a head gimbal assembly, a head arm assembly and a magnetic disk drive each of which incorporates the magnetoresistive element.

A magnetoresistive element of the invention incorporates: a nonmagnetic layer having a first surface and a second surface that face toward opposite directions; a pinned layer disposed adjacent to the first surface of the nonmagnetic layer, a direction of magnetization in the pinned layer being fixed, and a free layer disposed adjacent to the second surface of the nonmagnetic layer, a direction of magnetization in the free layer changing in response to an external magnetic field. In the magnetoresistive element of the invention, a current for detecting magnetic signals is fed in a direction intersecting a plane of each of the layers that make up the magnetoresistive element.

In the magnetoresistive element of the invention, at least one of the pinned layer and the free layer includes an underlying magnetic layer made of a magnetic alloy layer having a body-centered cubic structure, and a Heusler alloy layer formed on the underlying magnetic layer. The Heusler alloy layer is made of a CoMnSi alloy having an Mn content higher than 25 atomic percent and lower than or equal to 40 atomic percent, and the Heusler alloy layer contains a principal component having a B2 structure in which Co atoms are placed at body-centered positions of unit cells and Mn atoms or Si atoms are randomly placed at vertexes of the unit cells.

The spin polarization of the Heusler alloy layer of the invention is higher than the spin polarization of an alloy layer made of a CoMnSi alloy in which Co, Mn and Si are in the proportion of 2:1:1 in the case where such an alloy layer is formed on the underlying magnetic layer.

In the magnetoresistive element of the invention, the Co content of the CoMnSi alloy is preferably within a range of 48 to 52 atomic percent inclusive.

In the magnetoresistive element of the invention, the Mn content of the CoMnSi alloy is preferably within a range of 30 to 40 atomic percent inclusive.

In the magnetoresistive element of the invention, the underlying magnetic layer may contain 'y' atomic percent Fe and (100−y) atomic percent Co, where y may be within a range of 30 to 100 inclusive.

In the magnetoresistive element of the invention, the pinned layer may include the underlying magnetic layer and the Heusler alloy layer, and the Heusler alloy layer that the pinned layer includes may be disposed between the underlying magnetic layer that the pinned layer includes and the nonmagnetic layer. In this case, the pinned layer may further include a middle magnetic layer disposed between the Heusler alloy layer that the pinned layer includes and the nonmagnetic layer. The middle magnetic layer may contain 'z' atomic percent Fe and (100−z) atomic percent Co, where z may be within a range of 30 to 100 inclusive.

The pinned layer may further include: a nonmagnetic middle layer disposed at such a location that the underlying magnetic layer that the pinned layer includes is sandwiched between the nonmagnetic middle layer and the Heusler alloy layer that the pinned layer includes; and a ferromagnetic layer disposed at such a location that the nonmagnetic middle layer is sandwiched between the ferromagnetic layer and the underlying magnetic layer that the pinned layer includes, a direction of magnetization in the ferromagnetic layer being fixed. In this case, a direction of magnetization in each of the underlying magnetic layer, the Heusler alloy layer and the middle magnetic layer that the pinned layer includes is fixed to a direction opposite to the direction of magnetization in the ferromagnetic layer.

In the magnetoresistive element of the invention, the free layer may include the underlying magnetic layer and the Heusler alloy layer, and the underlying magnetic layer that the free layer includes may be disposed between the Heusler alloy layer that the free layer includes and the nonmagnetic layer.

In the magnetoresistive element of the invention, the nonmagnetic layer may be made of a conductive material or may be a tunnel barrier layer made of an insulating material.

A magnetoresistive element manufactured by a method of manufacturing a magnetoresistive element of the invention incorporates: a nonmagnetic layer having a first surface and a second surface that face toward opposite directions; a pinned layer disposed adjacent to the first surface of the nonmagnetic layer, a direction of magnetization in the pinned layer being fixed, and a free layer disposed adjacent to the second surface of the nonmagnetic layer, a direction of magnetization in the free layer changing in response to an external magnetic field, wherein a current for detecting magnetic signals is fed in a direction intersecting a plane of each of the foregoing layers.

The method of the invention includes the steps of forming the pinned layer, the nonmagnetic layer and the free layer, respectively. At least one of the step of forming the pinned layer and the step of forming the free layer includes the step of forming an underlying magnetic layer made of a magnetic alloy layer having a body-centered cubic structure, and the step of forming a Heusler alloy layer on the underlying magnetic layer. The Heusler alloy layer is made of a CoMnSi alloy having an Mn content higher than 25 atomic percent and lower than or equal to 40 atomic percent, and the Heusler alloy layer contains a principal component having a B2 structure in which Co atoms are placed at body-centered positions of unit cells and Mn atoms or Si atoms are randomly placed at vertexes of the unit cells.

The method of the invention may further include the step of performing heat treatment on the Heusler alloy layer to make the crystal structure of the principal component of the Heusler alloy layer the B2 structure.

A thin-film magnetic head of the invention incorporates: a medium facing surface that faces toward a recording medium; the magnetoresistive element of the invention disposed near the medium facing surface to detect a signal magnetic field sent from the recording medium; and a pair of electrodes for feeding a current for detecting magnetic signals to the magnetoresistive element in a direction intersecting a plane of each layer making up the magnetoresistive element.

A head gimbal assembly of the invention incorporates: a slider including the thin-film magnetic head of the invention and disposed to face toward a recording medium; and a suspension flexibly supporting the slider. A head arm assembly of the invention incorporates: a slider including the thin-film magnetic head of the invention and disposed to face toward a recording medium; a suspension flexibly supporting the slider; and an arm for making the slider travel across tracks of the recording medium, the suspension being attached to the arm.

A magnetic disk drive of the invention incorporates: a slider including the thin-film magnetic head of the invention and disposed to face toward a recording medium that is driven to rotate; and an alignment device supporting the slider and aligning the slider with respect to the recording medium.

According to the invention, at least one of the pinned layer and the free layer of the magnetoresistive element includes an underlying magnetic layer made of a magnetic alloy layer having a body-centered cubic structure, and a Heusler alloy layer formed on the underlying magnetic layer. The Heusler alloy layer is made of a CoMnSi alloy wherein the Mn content is higher than 25 atomic percent and lower than or equal to 40 atomic percent, and the Heusler alloy layer contains a principal component having the B2 structure in which Co atoms are placed at body-centered positions of the unit cells and Mn atoms or Si atoms are randomly placed at vertexes of the unit cells. The spin polarization of the Heusler alloy layer of the invention is higher than the spin polarization of an alloy layer made of a CoMnSi alloy in which Co, Mn and Si are in the proportion of 2:1:1 in the case where such an alloy layer is formed on the underlying magnetic layer. As a result, according to the invention, it is possible to increase the magnetoresistance change ratio of the magnetoresistive element to which a current is fed in a direction intersecting the plane of each of the layers making up the magnetoresistive element.

Other and further objects, features and advantages of the invention will appear more fully from the following description.

DETAILED DESCRIPTION OF THE PREFERRED EMBODIMENTS

First Embodiment

Figure 2:
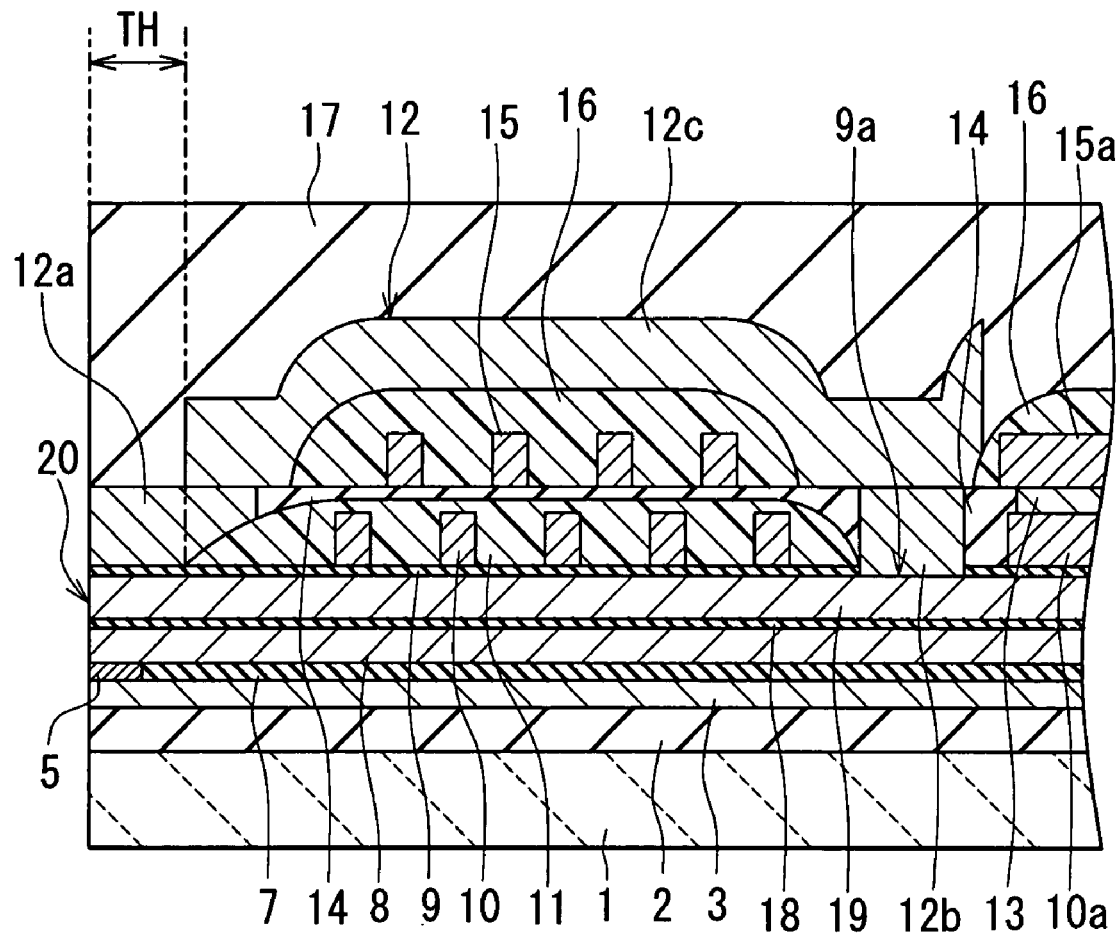
FIG. 2 is a cross-sectional view of a thin-film magnetic head of the first embodiment of the invention, wherein the cross section is orthogonal to the medium facing surface and the substrate.
Figure 3:
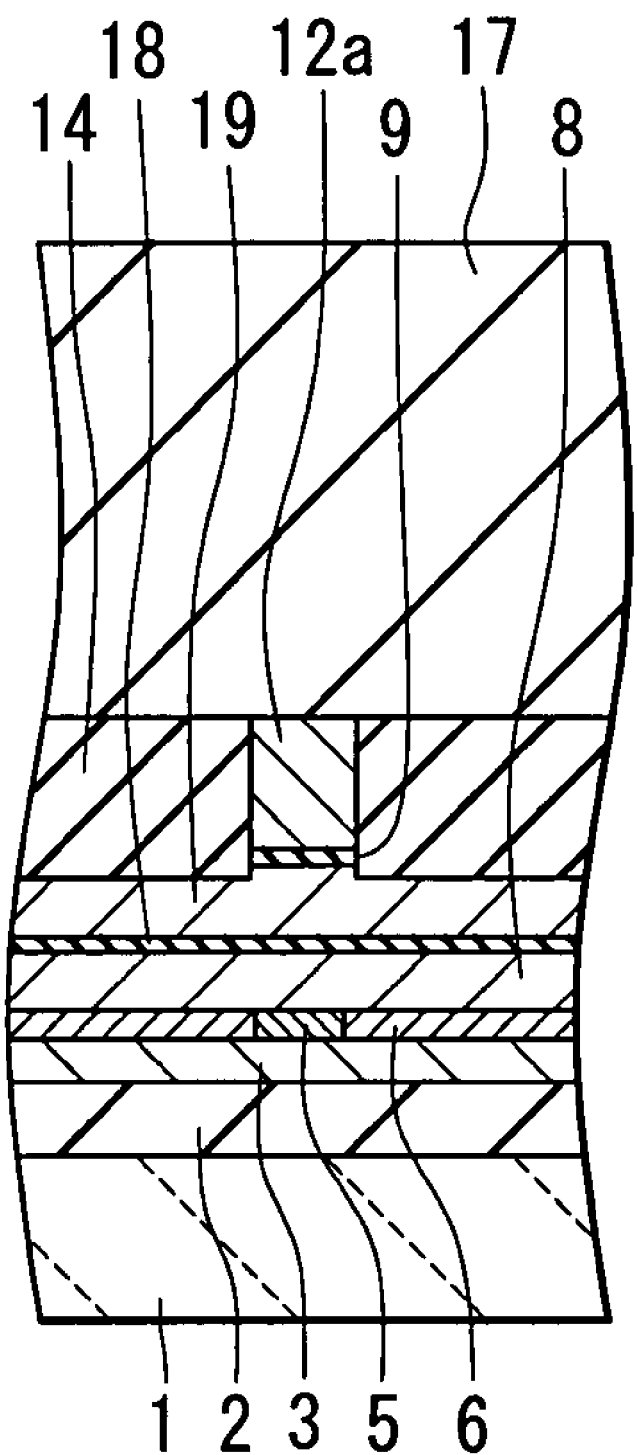
FIG. 3 is a cross-sectional view of the pole portion of the thin-film magnetic head of the first embodiment of the invention, wherein the cross section is parallel to the medium facing surface.

Preferred embodiments of the invention will now be described in detail with reference to the accompanying drawings. Reference is now made to FIG. 2 and FIG. 3 to describe the outlines of the configuration and a manufacturing method of a thin-film magnetic head of a first embodiment of the invention. FIG. 2 illustrates a cross section of the thin-film magnetic head orthogonal to a medium facing surface and a substrate. FIG. 3 illustrates a cross section of a pole portion of the thin-film magnetic head parallel to the medium facing surface.

In the method of manufacturing the thin-film magnetic head of the embodiment, first, an insulating layer 2 made of an insulating material such as alumina ($Al_2O_3$) and having a thickness of 1 to 5 µm, for example, is formed by a method such as sputtering on a substrate 1 made of a ceramic such as aluminum oxide and titanium carbide ($Al_2O_3$—TiC). Next, a first shield layer 3 for a read head having a specific pattern and made of a magnetic material such as NiFe or FeAlSi is formed on the insulating layer 2 by a method such as plating. Next, although not shown, an insulating layer of alumina, for example, is formed over the entire surface. Next, the insulating layer is polished by chemical mechanical polishing (CMP), for example, so that the first shield layer 3 is exposed, and the top surfaces of the first shield layer 3 and the insulating layer are thereby flattened.

Next, an MR element 5 for reading is formed on the first shield layer 3. Next, although not shown, an insulating film is formed to cover the two sides of the MR element 5 and the top surface of the first shield layer 3. The insulating film is made of an insulating material such as alumina. Next, two bias field applying layers 6 are formed to be located adjacent to the two sides of the MR element 5 with the insulating film disposed in between. Next, an insulating layer 7 is formed to be disposed around the MR element 5 and the bias field applying layers 6. The insulating layer 7 is made of an insulating material such as alumina.

Next, a second shield layer 8 for the read head is formed on the MR element 5, the bias field applying layers 6 and the insulating layer 7. The second shield layer 8 is made of a magnetic material and may be formed by plating or sputtering, for example. Next, a separating layer 18 made of a non-magnetic material such as alumina is formed by sputtering, for example, on the second shield layer 8. Next, a bottom pole layer 19 provided for a write head and made of a magnetic material is formed on the separating layer 18 by plating or sputtering, for example. The magnetic material used for the second shield layer 8 and the bottom pole layer 19 is a soft magnetic material such as NiFe, CoFe, CoFeNi or FeN. Alternatively, a second shield layer that also functions as a bottom pole layer may be provided in place of the second shield layer 8, the separating layer 18 and the bottom pole layer 19.

Next, a write gap layer 9 made of a nonmagnetic material such as alumina and having a thickness of 50 to 300 nm, for example, is formed on the bottom pole layer 19 by a method such as sputtering. Next, to make a magnetic path, a portion of the write gap layer 9 is etched to form a contact hole 9a in a center portion of a thin-film coil described later.

Next, a first layer portion 10 of the thin-film coil made of copper (Cu), for example, and having a thickness of 2 to 3 µm, for example, is formed on the write gap layer 9. In FIG. 2 numeral 10a indicates a connecting portion of the first layer portion 10 connected to a second layer portion 15 of the thin-film coil described later. The first layer portion 10 is wound around the contact hole 9a.

Next, an insulating layer 11 having a specific pattern is formed to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is performed at a specific temperature to flatten the surface of the insulating layer 11. Through this heat treatment, each of the outer and inner edge portions of the insulating layer 11 is made to have a shape of rounded sloped surface.

Next, a track width defining layer 12a of a top pole layer 12 made of a magnetic material for the write head is formed on regions of the write gap layer 9 and the insulating layer 11, the regions extending from a sloped portion of the insulating layer 11 closer to a medium facing surface 20 described later toward the medium facing surface 20. The top pole layer 12 is made up of the track width defining layer 12a, and a coupling portion layer 12b and a yoke portion layer 12c that will be described later.

The track width defining layer 12a has: a tip portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12c. The tip portion has a width equal to the write track width. The connecting portion has a width greater than that of the tip portion.

When the track width defining layer 12a is formed, the coupling portion layer 12b made of a magnetic material is formed in the contact hole 9a, and a connecting layer 13 made of a magnetic material is formed on the connecting portion 10a at the same time. The coupling portion layer 12b makes up a portion of the top pole layer 12 that is magnetically coupled to the bottom pole layer 19.

Next, pole trimming is performed. That is, in a region around the track width defining layer 12a, the write gap layer 9 and at least a portion of the pole portion of the bottom pole layer 19 close to the write gap layer 9 are etched, using the track width defining layer 12a as a mask. As a result, as shown in FIG. 3, a trim structure is formed, wherein the pole portion of the top pole layer 12, the write gap layer 9 and at least a portion of the pole portion of the bottom pole layer 19 have equal widths. The trim structure has an effect of preventing an increase in effective track width resulting from an expansion of magnetic flux near the write gap layer 9.

Next, an insulating layer 14 made of an inorganic insulating material such as alumina and having a thickness of 3 to 4 µm, for example, is formed over the entire surface. The insulating layer 14 is then polished by CMP, for example, to reach the surfaces of the track width defining layer 12a, the coupling portion layer 12b and the connecting layer 13, and flattened.

Next, the second layer portion 15 of the thin-film coil made of copper (Cu), for example, and having a thickness of 2 to 3 µm, for example, is formed on the flattened insulating layer 14. In FIG. 2 numeral 15a indicates a connecting portion of the second layer portion 15 connected to the connecting portion 10a of the first layer portion 10 of the thin-film coil through the connecting layer 13. The second layer portion 15 is wound around the coupling portion layer 12b.

Next, an insulating layer 16 having a specific pattern is formed to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is performed at a specific temperature to flatten the surface of the insulating layer 16. Through this heat treatment, each of the outer and inner edge portions of the insulating layer 16 is made to have a shape of rounded sloped surface.

Next, the yoke portion layer 12c made of a magnetic material for the write head such as Permalloy is formed on the track width defining layer 12a, the insulating layers 14 and 16, and the coupling portion layer 12b. The yoke portion layer 12c makes up the yoke portion of the top pole layer 12. An end of the yoke portion layer 12c closer to the medium facing surface 20 is located apart from the medium facing surface 20. The yoke portion layer 12c is connected to the bottom pole layer 19 through the coupling portion layer 12b.

Next, an overcoat layer 17 made of alumina, for example, is formed to cover the entire surface. Finally, machining of the slider including the foregoing layers is performed to form the medium facing surface 20 of the thin-film magnetic head including the write head and the read head. The thin-film magnetic head is thus completed.

The thin-film magnetic head thus manufactured incorporates the medium facing surface 20 that faces toward a recording medium, the read head and the write head. The configuration of the read head will be described in detail later.

The write head incorporates the bottom pole layer 19 and the top pole layer 12 that are magnetically coupled to each other and include the pole portions that are opposed to each other and placed in regions on a side of the medium facing surface 20. The write head further incorporates: the write gap layer 9 provided between the pole portion of the bottom pole layer 19 and the pole portion of the top pole layer 12; and the thin-film coil including the portions 10 and 15 at least part of which is placed between the bottom pole layer 19 and the top pole layer 12 and insulated from the bottom pole layer 19 and the top pole layer 12. In the thin-film magnetic head, as shown in FIG. 2, throat height TH is the length from the medium facing surface 20 to the end of the insulating layer 11 closer to the medium facing surface 20. The throat height is the length (height) from the medium facing surface 20 to the point at which the distance between the two pole layers starts to increase.

Figure 1:
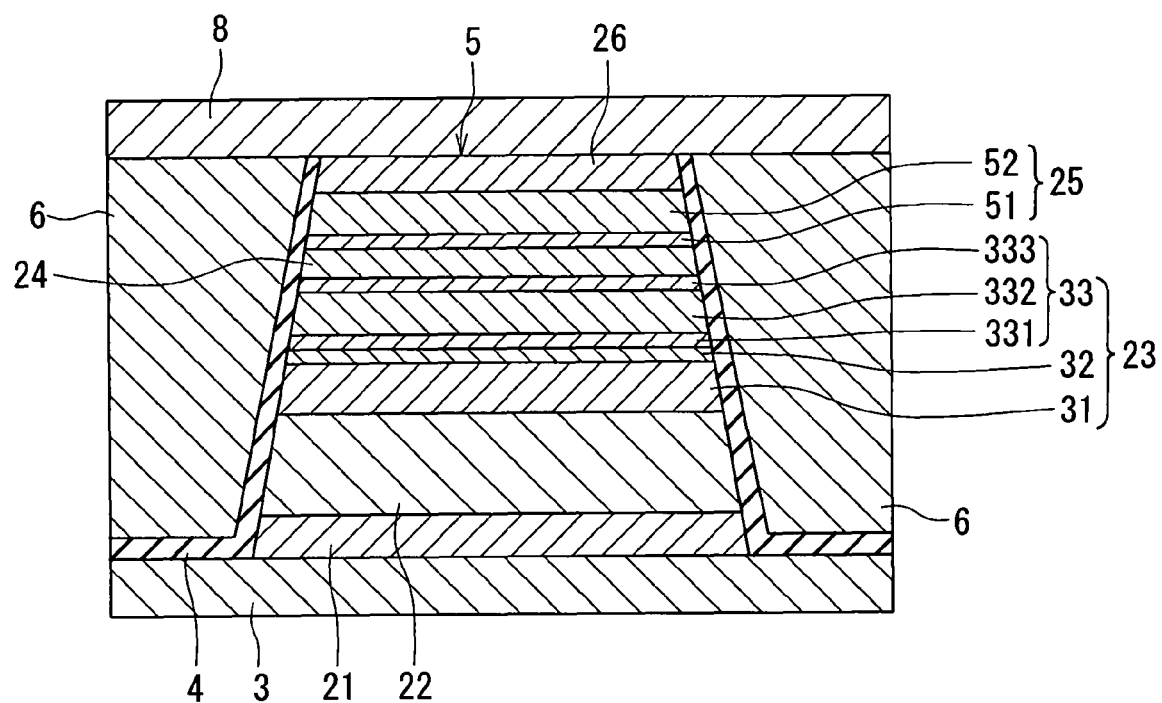
FIG. 1 is a cross-sectional view of a read head of a first embodiment of the invention, wherein the cross section is parallel to the medium facing surface.

Reference is now made to FIG. 1 to describe the details of the configuration of the read head. FIG. 1 is a cross-sectional view of the read head parallel to the medium facing surface.

The read head of the embodiment incorporates: the first shield layer 3 and the second shield layer 8 disposed with a specific space from each other; the MR element 5 disposed between the first shield layer 3 and the second shield layer 8; the insulating film 4 that covers the two sides of the MR element 5 and the top surface of the first shield layer 3; and the two bias field applying layers 6 disposed adjacent to the two sides of the MR element 5 with the insulating film 4 disposed in between. The insulating film 4 is made of alumina, for example. The bias field applying layers 6 are each made of a hard magnetic layer (hard magnet) or a layered structure made up of ferromagnetic layers and antiferromagnetic layers, for example. To be specific, the bias field applying layers 6 are made of CoPt or CoCrPt, for example.

The read head of the embodiment has the CPP structure. The first shield layer 3 and the second shield layer 8 also function as a pair of electrodes for feeding a sense current to the MR element 5 in a direction intersecting the plane of each layer making up the MR element 5, such as the direction perpendicular to the plane of each layer making up the MR element 5. Besides the first and second shield layers 3 and 8, a pair of electrodes may be further provided on the top and bottom of the MR element 5, respectively. The MR element 5 is a CPP-GMR element. The resistance of the MR element 5 changes in response to an external magnetic field, that is, a signal magnetic field sent from the recording medium. A sense current is fed in a direction intersecting the plane of each layer making up the MR element 5, such as the direction perpendicular to the plane of each layer making up the MR element 5. It is possible to determine the resistance of the MR element 5 from the sense current. It is thereby possible to read data stored on the recording medium through the use of the read head.

The MR element 5 incorporates an underlying layer 21, an antiferromagnetic layer 22, a pinned layer 23, a nonmagnetic conductive layer 24, a free layer 25 and a protection layer 26 that are stacked one by one on the first shield layer 3. The pinned layer 23 is a layer in which the direction of magnetization is fixed. The antiferromagnetic layer 22 is a layer that fixes the direction of magnetization in the pinned layer 23 by exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The free layer 25 is a layer in which the direction of magnetization changes in response to an external magnetic field, that is, a signal magnetic field sent from the recording medium. The protection layer 26 is a layer for protecting the layers therebelow.

The underlying layer 21 has a thickness of 2 to 6 nm, for example. The underlying layer 21 may be made of a layered structure made up of a Ta layer and an NiFeCr layer, for example.

The antiferromagnetic layer 22 has a thickness of 5 to 30 nm, for example, and may be made of an antiferromagnetic material including Mn and at least one element $M_{II}$ among the group consisting of Pt, Ru, Rh, Pd, Ni, Cu, Ir, Cr and Fe. The Mn content of the material preferably falls within a range of 35 to 95 atomic % inclusive. The content of the other element $M_{II}$ of the material preferably falls within a range of 5 to 65 atomic % inclusive. One type of antiferromagnetic material is a non-heat-induced antiferromagnetic material that exhibits antiferromagnetism without any heat treatment and induces an exchange coupling magnetic field between a ferromagnetic material and itself. Another type of antiferromagnetic material is a heat-induced antiferromagnetic material that exhibits antiferromagnetism by undergoing heat treatment. The antiferromagnetic layer 22 may be made of either of these types.

The non-heat-induced antiferromagnetic materials include an Mn alloy that has a γ phase, such as RuRhMn, FeMn, and IrMn. The heat-induced antiferromagnetic materials include an Mn alloy that has a regular crystal structure, such as PtMn, NiMn, and PtRhMn.

The direction of magnetization is fixed in the pinned layer 23 by means of the exchange coupling with the antiferromagnetic layer 22 at the interface between the antiferromagnetic layer 22 and the pinned layer 23. The pinned layer 23 of the embodiment is a so-called synthetic pinned layer that incorporates an outer layer 31, a nonmagnetic middle layer 32 and an inner layer 33 that are stacked in this order on the antiferromagnetic layer 22. The outer layer 31 includes a ferromagnetic layer made of a ferromagnetic material including at least Co selected from the group consisting of Co and Fe. The inner layer 33 and the outer layer 31 are antiferromagnetic-coupled to each other and the directions of magnetization thereof are fixed to opposite directions. The outer layer 31 has a thickness of 3 to 7 nm, for example. The inner layer 33 has a thickness of 3 to 7 nm, for example.

The nonmagnetic middle layer 32 has a thickness of 0.35 to 1.0 nm, for example, and may be made of a nonmagnetic material including at least one element among the group consisting of Ru, Rh, Ir, Re, Cr, Zr and Cu. The nonmagnetic middle layer 32 is provided for creating antiferromagnetic exchange coupling between the inner layer 33 and the outer layer 31, and for fixing the magnetizations of these layers to opposite directions. The magnetizations of the inner layer 33 and the outer layer 31 in opposite directions include not only the case in which there is a difference of 180 degrees between these directions of magnetizations, but also the case in which there is a difference of 180±120 degrees between them.

The inner layer 33 includes an underlying magnetic layer 331, a Heusler alloy layer 332 and a middle magnetic layer 333 that are stacked in this order on the nonmagnetic middle layer 32. The directions of magnetization in the underlying magnetic layer 331, the Heusler alloy layer 332 and the middle magnetic layer 333 are fixed to the direction opposite to the direction of magnetization in the outer layer 31. The underlying magnetic layer 331, the Heusler alloy layer 332 and the middle magnetic layer 333 will be described in detail later.

The nonmagnetic conductive layer 24 has a thickness of 1.0 to 4.0 nm, for example, and may be made of a nonmagnetic conductive material that includes 80 weight percent or greater of at least one element among the group consisting of Cu, Au and Ag. The nonmagnetic conductive layer 24 corresponds to the nonmagnetic layer of the invention.

The free layer 25 incorporates an underlying magnetic layer 51 and a Heusler alloy layer 52 that are stacked in this order on the nonmagnetic conductive layer 24. Details of these layers will be described later.

The protection layer 26 has a thickness of 0.5 to 10 nm, for example. The protection layer 26 may be made of an Ru layer having a thickness of 10 nm, for example.

A method of manufacturing the MR element 5 of the embodiment includes the steps of forming the underlying layer 21, the antiferromagnetic layer 22, the pinned layer 23, the nonmagnetic conductive layer 24, the free layer 25 and the protection layer 26 in this order on the first shield layer 3 by sputtering, for example.

The operation of the thin-film magnetic head of the embodiment will now be described. The thin-film magnetic head writes data on a recording medium by using the write head and reads data written on the recording medium by using the read head.

In the read head, the direction of the bias magnetic field created by the bias field applying layers 6 intersects the direction orthogonal to the medium facing surface 20 at a right angle. In the MR element 5, the direction of magnetization in the free layer 25 is aligned with the direction of the bias magnetic field when no signal magnetic field exists. The direction of magnetization in the pinned layer 23 is fixed to the direction orthogonal to the medium facing surface 20.

In the MR element 5, the direction of magnetization of the free layer 25 changes in response to the signal magnetic field sent from the recording medium. The relative angle between the direction of magnetization of the free layer 25 and the direction of magnetization of the pinned layer 23 is thereby changed. As a result, the resistance of the MR element 5 changes. The resistance of the MR element 5 is obtained from the potential difference between the first and second shield layers 3 and 8 when a sense current is fed to the MR element 5 from the shield layers 3 and 8. In such a manner, the data stored on the recording medium is read by the read head.

Features of the MR element 5 of the embodiment will now be described. The MR element 5 of the embodiment incorporates: the nonmagnetic conductive layer 24 having a first surface (bottom surface) and a second surface (top surface) facing toward opposite directions; the pinned layer 23 disposed adjacent to the first surface (the bottom surface) of the nonmagnetic conductive layer 24, the direction of magnetization in the pinned layer 23 being fixed; and the free layer 25 disposed adjacent to the second surface (the top surface) of the nonmagnetic conductive layer 24, the direction of magnetization in the free layer 25 changing in response to an external magnetic field. A sense current is fed to the MR element 5 in a direction intersecting the plane of each layer making up the MR element 5, such as the direction perpendicular to the plane of each layer making up the MR element 5.

The pinned layer 23 of the embodiment incorporates the outer layer 31, the nonmagnetic middle layer 32 and the inner layer 33 that are stacked in this order on the antiferromagnetic layer 22. The inner layer 33 includes the underlying magnetic layer 331, the Heusler alloy layer 332 and the middle magnetic layer 333 that are stacked in this order on the nonmagnetic middle layer 32.

The underlying magnetic layer 331 is made of a magnetic alloy layer having a body-centered cubic structure. The underlying magnetic layer 331 contains at least Fe among the group consisting of Fe, Co and Ni. It is preferred that the underlying magnetic layer 331 contain 'y' atomic percent Fe and (100-y) atomic percent Co, where y is within a range of 30 to 100 inclusive. Typically, the crystal structure of Fe or a CoFe alloy that contains y atomic percent Fe and (100-y) atomic percent Co, where y is within a range of 30 to 100 inclusive, is a body-centered cubic structure.

The Heusler alloy layer 332 is made of a CoMnSi alloy wherein the Mn content is higher than 25 atomic percent and lower than or equal to 40 atomic percent, and includes a principal component having a B2 structure wherein Co atoms are placed at body-centered positions of unit cells, and Mn atoms or Si atoms are randomly placed at vertexes of the unit cells. Here, the 'principal component' of the Heusler alloy layer 332 is a component of the crystal structure that is greatest in number when the crystal structure of the Heusler alloy layer 332 is determined by X-ray diffraction. To form the Heusler alloy layer 332 including the principal component having the B2 structure mentioned above, it is preferred that the Co content of the CoMnSi alloy making up the Heusler alloy layer 332 be 50 atomic percent or nearly 50 atomic percent, and specifically within a range of 48 to 52 atomic percent inclusive. Furthermore, it is preferred that the Mn content of the CoMnSi alloy making up the Heusler alloy layer 332 be within a range of 30 to 40 atomic percent inclusive, which will be described in detail later.

The middle magnetic layer 333 contains at least Fe among the group consisting of Fe, Co and Ni. It is preferred that the middle magnetic layer 333 contain 'z' atomic percent Fe and (100-z) atomic percent Co, where z is within a range of 30 to 100 inclusive.

In the method of manufacturing the MR element 5 of the embodiment, the step of forming the pinned layer 23 includes the steps of forming the outer layer 31, the nonmagnetic middle layer 32, the underlying magnetic layer 331, the Heusler alloy layer 332, and the middle magnetic layer 333 in this order on the antiferromagnetic layer 22 by sputtering, for example.

The free layer 25 of the embodiment includes the underlying magnetic layer 51 and the Heusler alloy layer 52 that are stacked in this order on the nonmagnetic conductive layer 24. The underlying magnetic layer 51 is made of a magnetic alloy layer having a body-centered cubic structure. The underlying magnetic layer 51 contains at least Fe among the group consisting of Fe, Co and Ni. It is preferred that the underlying magnetic layer 51 contain 'y' atomic percent Fe and (100-y) atomic percent Co, where y is within a range of 30 to 100 inclusive. Typically, the crystal structure of Fe or a CoFe alloy that contains y atomic percent Fe and (100-y) atomic percent Co, where y is within a range of 30 to 100 inclusive, is a body-centered cubic structure.

The Heusler alloy layer 52 is made of a CoMnSi alloy wherein the Mn content is higher than 25 atomic percent and lower than or equal to 40 atomic percent, and includes a principal component having a B2 structure wherein Co atoms are placed at body-centered positions of unit cells, and Mn atoms or Si atoms are randomly placed at vertexes of the unit cells. Here, the 'principal component' of the Heusler alloy layer 52 is a component of the crystal structure that is greatest in number when the crystal structure of the Heusler alloy layer 52 is determined by X-ray diffraction. To form the Heusler alloy layer 52 including the principal component of the B2 structure mentioned above, it is preferred that the Co content of the CoMnSi alloy making up the Heusler alloy layer 52 be 50 atomic percent or nearly 50 atomic percent, and specifically within a range of 48 to 52 atomic percent inclusive. Furthermore, it is preferred that the Mn content of the CoMnSi alloy making up the Heusler alloy layer 52 be within a range of 30 to 40 atomic percent inclusive, which will be described in detail later.

In the method of manufacturing the MR element 5 of the embodiment, the step of forming the free layer 25 includes the steps of forming the underlying magnetic layer 51 and the Heusler alloy layer 52 in this order on the nonmagnetic conductive layer 24 by sputtering, for example.

The method of manufacturing the MR element 5 of the embodiment includes the step of performing heat treatment on the Heusler alloy layers 332 and 52 so that the crystal structure of the principal component of each of the Heusler alloy layers 332 and 52 is made the B2 structure. The principal crystal structure of the Heusler alloy layers 332 and 52 immediately after they are formed is the A2 structure. In the above-mentioned heat treatment, the crystal structure of the principal component of each of the Heusler alloy layers 332 and 52 is changed into the B2 structure by heating the Heusler alloy layers 332 and 52 at a specific temperature. A lowest temperature for the heat treatment that is capable of changing the crystal structure of the Heusler alloy layers 332 and 52 into the B2 structure will be hereinafter called a B2 regulation temperature.

Figure 8:
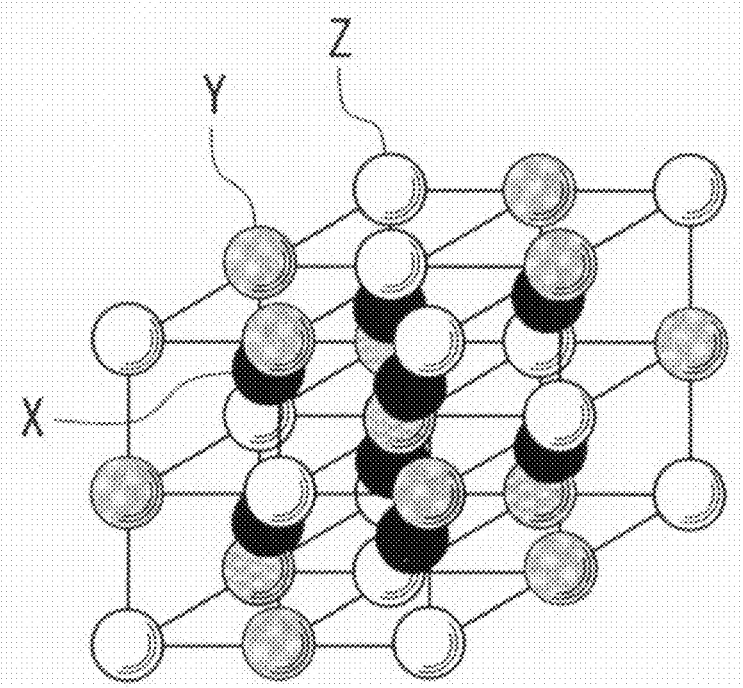
FIG. 8 is a view for illustrating an $L2_1$ structure.
Figure 9:
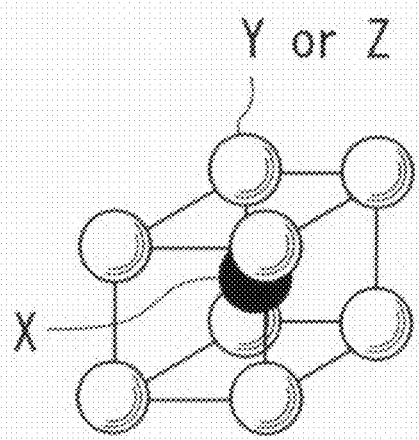
FIG. 9 is a view for illustrating a B2 structure.
Figure 10:
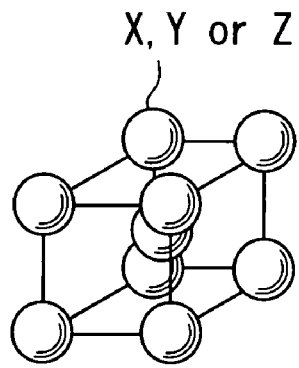
FIG. 10 is a view for illustrating an A2 structure.

Reference is now made to FIG. 8 to FIG. 10 to describe types of the crystal structure that a typical full Heusler alloy can have. Here, the chemical composition of a typical full Heusler alloy is indicated as $X_2YZ$, as in the description of the section 'Description of the Related Art'. A typical full Heusler alloy can have three types of crystal structure, that is, the $L2_1$ structure, the B2 structure and the A2 structure. FIG. 8 illustrates the $L2_1$ structure. FIG. 9 illustrates the B2 structure. FIG. 10 illustrates the A2 structure. Each of the $L2_1$ structure, the B2 structure and the A2 structure is similar to the body-centered cubic structure.

In the $L2_1$ structure shown in FIG. 8, atoms of an element X are respectively placed at body-centered positions of unit cells, and atoms of an element Y and atoms of an element Z are alternately placed at vertexes of the unit cells regularly.

In the B2 structure shown in FIG. 9, atoms of the element X are respectively placed at body-centered positions of unit cells, and atoms of the element Y or atoms of the element Z are randomly placed at vertexes of the unit cells.

In the A2 structure shown in FIG. 10, atoms of the element X, atoms of the element Y, or atoms of the element Z are randomly placed at each of body-centered positions and vertexes of unit cells.

Among the $L2_1$ structure, the B2 structure and the A2 structure, a high spin polarization occurs in the $L2_1$ structure and the B2 structure.

In the CoMnSi alloy that forms the Heusler alloy layers 332 and 52 of the embodiment, Co, Mn and Si are not in the proportion of stoichiometric composition, that is, not in the proportion of 2:1:1. Therefore, the crystal structure of the Heusler alloy layers 332 and 52 of the embodiment is the B2 or A2 structure. As previously described, the principal crystal structure of the Heusler alloy layers 332 and 52 immediately after they are formed is the A2 structure, but it is possible that, by performing heat treatment on the Heusler alloy layers 332 and 52, the crystal structure of the principal component of each of the Heusler alloy layers 332 and 52 is changed into the B2 structure in which a high spin polarization occurs.

As previously described, the B2 and A2 structures are similar to the body-centered cubic structure. Therefore, it is easy to make the crystal structure of the principal component of each of the Heusler alloy layer 332 and 51 the B2 structure by employing the underlying magnetic layers 331 and 51 made of magnetic alloy layers having the body-centered cubic structure as base layers underlying the Heusler alloy layer 332 and 51, respectively. To form the underlying magnetic layers 331 and 51 made of magnetic alloy layers having the body-centered cubic structure, it is preferred that the material of these layers be Fe or a CoFe alloy that contains y atomic percent Fe and (100−y) atomic percent Co, where y is within a range of 30 to 100 inclusive.

The inventors of the present patent application performed the following experiment in the course of arriving at the present invention. First, the inventors fabricated a CPP-GMR element in which the pinned layer and the free layer were formed of CoMnSi alloy layers having the stoichiometric composition wherein Co, Mn and Si were in the proportion of 2:2:1 and having the B2 structure. The CoMnSi alloy layers were respectively formed on magnetic alloy layers having the body-centered cubic structure. The MR ratio of the CPP-GMR element thus fabricated was not more than approximately 5 percent, as mentioned in the section 'Description of the Related Art' of the specification.

Next, the lattice constant of the (100) plane of the CoMnSi alloy layer having the B2 structure formed on the magnetic alloy layer having the body-centered cubic structure as described above was measured by X-ray diffraction. The value obtained was approximately 2.8 Å (1 Å=0.1 nm). The lattice constant of the (100) plane of a bulk CoMnSi alloy is approximately 3.0 Å. The lattice constant of the (100) plane of the above-mentioned CoMnSi alloy layer is smaller than that of the bulk CoMnSi alloy by about 7 percent. It is assumed that the reason why the lattice constant of the CoMnSi alloy layer is thus smaller than that of the bulk CoMnSi alloy is that the lattice constant of the CoMnSi alloy layer depends on the lattice constant of the magnetic alloy layer that underlies the CoMnSi alloy layer.

Next, electronic state calculation was performed using a program of first-principles calculation open to the public. The results indicated that, in a CoMnSi alloy having the stoichiometric composition wherein Co, Mn and Si are in the proportion of 2:1:1, a high spin polarization is not obtained where the lattice constant is 2.8 Å, even though the alloy has the B2 structure.

Electronic state calculation using the program of first-principles calculation was further performed to find out that, in a CoMnSi alloy having the B2 structure and a lattice constant of 2.8 Å, making the Mn content higher than 25 atomic percent while fixing the Co content to 50 atomic percent leads to a higher spin polarization than that obtained in a case where the Mn content is 25 atomic percent.

Then, a CPP-GMR element was actually fabricated, wherein the pinned layer and the free layer were formed of CoMnSi alloy layers having the B2 structure and having a Co content within a range of 48 to 52 atomic percent inclusive and an Mn content equal to or higher than 30 atomic percent. The CoMnSi alloy layers were respectively formed on magnetic alloy layers having the body-centered cubic structure. The MR ratio of the CPP-GMR element thus fabricated was approximately 10 percent.

Through the foregoing experiment, the inventors of the present patent application have arrived at the present invention. The Heusler alloy layer of the present invention is formed on the underlying magnetic layer, and is made of a CoMnSi alloy wherein the Mn content is higher than 25 atomic percent and lower than or equal to 40 atomic percent. Furthermore, the Heusler alloy layer contains a principal component having the B2 structure in which Co atoms are respectively placed at body-centered positions of unit cells, and Mn atoms or Si atoms are randomly placed at vertexes of the unit cells. The spin polarization of the Heusler alloy layer of the invention is higher than the spin polarization of an alloy layer made of a CoMnSi alloy wherein Co, Mn and Si are in the proportion of 2:1:1 in the case where such an alloy layer is formed on the underlying magnetic layer.

Furthermore, from the results of electronic state calculation using the program of first-principles calculation, it was found out that, if a middle magnetic layer made of Fe or a CoFe alloy containing 'z' atomic percent Fe and (100−z) atomic percent Co, where z is within a range of 30 to 100 inclusive, is inserted between the Heusler alloy layer and the nonmagnetic conductive layer, the spin polarization at the interface of the Heusler alloy layer with respect to the middle magnetic layer is higher than the spin polarization at the interface of the Heusler alloy layer with respect to the nonmagnetic conductive layer. This teaches that it is possible to increase the MR ratio of the CPP-GMR element by inserting the middle magnetic layer between the Heusler alloy layer and the nonmagnetic conductive layer.

Results of an experiment that indicate the effects of the MR element 5 of the embodiment will now be described. In the experiment, first, the MR element 5 of an example of the embodiment and a reference MR element were actually fabricated, and the MR ratios thereof were measured. Table 1 shows the specific configuration of the MR element 5 of the example of the embodiment. Table 2 shows the specific configuration of the reference MR element. In Table 1, $Co_{50}Mn_xSi_{(50-x)}$ represents a CoMnSi alloy containing 50 atomic percent Co, x atomic percent Mn, and (50−x) atomic percent Si. In the example of the embodiment, x is within a range of 30 to 40 inclusive. Similarly, in Table 1, $Co_{70}Fe_{30}$ represents a CoFe alloy containing 30 atomic percent Fe and 70 atomic percent Co, and $Co_{(100-z)}Fe_z$ represents Fe or a CoFe alloy containing z atomic percent Fe and (100−z) atomic percent Co. In the example of the embodiment, z is within a range of 30 to 100 inclusive. In Table 2, $Co_{50}Mn_{25}Si_{25}$ represents a CoMnSi alloy containing 50 atomic percent Co, 25 atomic percent Mn, and 25 atomic percent Si. Similarly, in Table 2, $Co_{70}Fe_{30}$ represents a CoFe alloy containing 30 atomic percent Fe and 70 atomic percent Co.

TABLE 1

| Layer | Substance | Thickness (nm) |
|---|---|---|
| Protection layer | Ru | 10.0 |
| Free layer | $Co_{50}Mn_xSi_{(50-x)}$ | 4.0 |
| | $Co_{70}Fe_{30}$ | 1.0 |
| Nonmagnetic conductive layer | Cu | 2.2 |

TABLE 1-continued

| Layer | | Substance | Thickness (nm) |
|---|---|---|---|
| Pinned layer | Inner layer | $Co_{(100-z)}Fe_z$ | 1.0 |
| | | $Co_{50}Mn_xSi_{(50-x)}$ | 4.0 |
| | | $Co_{70}Fe_{30}$ | 1.0 |
| | Nonmagnetic middle layer | Ru | 0.4 or 0.8 |
| | Outer layer | $Co_{70}Fe_{30}$ | 5.0 |
| Antiferromagnetic layer | | IrMn | 7.0 |
| Underlying layer | | NiFeCr | 5.0 |
| | | Ta | 1.0 |

TABLE 2

| Layer | | Substance | Thickness (nm) |
|---|---|---|---|
| Protection layer | | Ru | 10.0 |
| Free layer | | $Co_{50}Mn_{25}Si_{25}$ | 4.0 |
| Nonmagnetic conductive layer | | Cu | 2.2 |
| Pinned layer | Inner layer | $Co_{50}Mn_{25}Si_{25}$ | 4.0 |
| | | $Co_{70}Fe_{30}$ | 1.0 |
| | Nonmagnetic middle layer | Ru | 0.4 or 0.8 |
| | Outer layer | $Co_{70}Fe_{30}$ | 5.0 |
| Antiferromagnetic layer | | IrMn | 7.0 |
| Underlying layer | | NiFeCr | 5.0 |
| | | Ta | 1.0 |

According to the results of the experiment, the MR ratio of the reference MR element was 6 percent. The MR ratio of the MR element 5 of the example of the embodiment was higher than that of the reference MR element in the entire range in which x was 30 to 40 inclusive and z was 30 to 100 inclusive. For example, the MR ratio of the MR element 5 of the example of the embodiment was 9.6 percent when x was 35 and z was 70, which was 1.6 times the MR ratio of the reference MR element.

Next, electronic state calculation was performed using a program of first-principles calculation to obtain spin polarization of a CoMnSi alloy having the B2 structure and a lattice constant of 2.8 Å. Here, the CoMnSi alloy was assumed as containing 50 atomic percent Co, x atomic percent Mn, and (50−x) atomic percent Si, and the calculation was performed for each of the cases where the value of x was 21, 25, 30, 35 and 40. In addition, layers made of CoMnSi alloys having the compositions used in the calculation were actually fabricated and the B2 regulation temperatures thereof were obtained by measurement. The Korringa-Kohn-Rostoker (KKR) method was employed for the first-principles calculation. The KKR method is introduced as enabling efficient calculation in an article of Oguchi, 'Development and Disclosure of First-principles Calculation Method', Kotai Butsuri [Solid-state Physics], 2004, Vol. 39, No. 11, pp. 184-185. For the electronic state calculation, used was a model in which the lattice constant was fixed to 2.8 Å, Co atoms were placed at body-centered positions of unit cells, and Mn atoms and Si atoms in the proportion corresponding to the value of x were placed randomly at vertexes of the unit cells.

Figure 11:
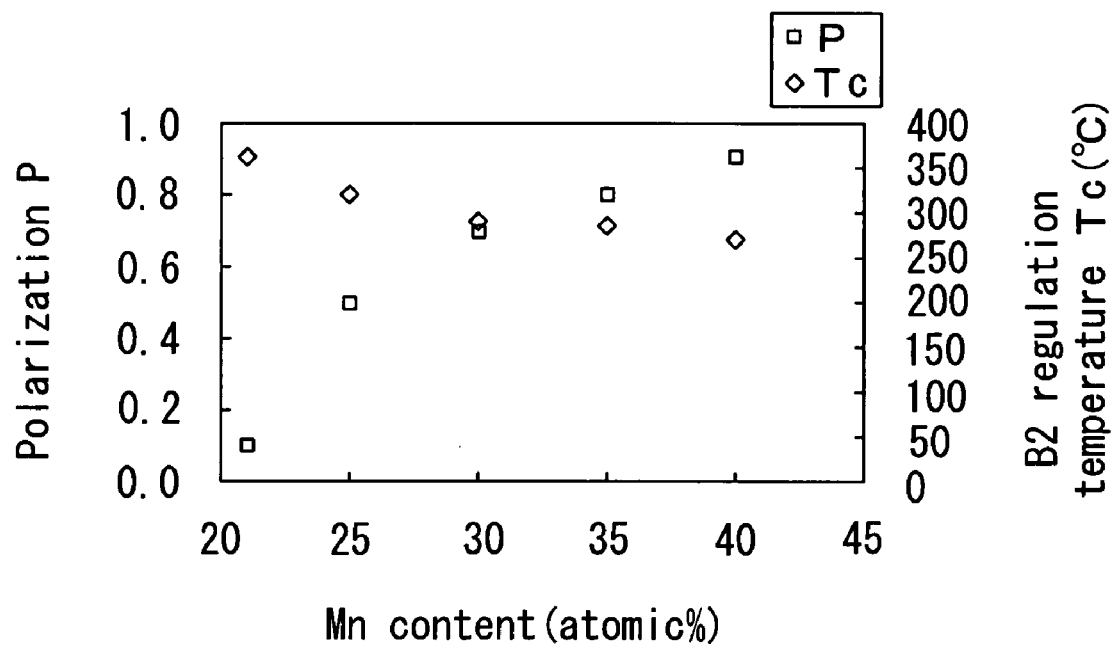
FIG. 11 is a plot showing the relationship among the Mn content, the spin polarization and the B2 regulation temperature of a CoMnSi alloy.

Table 3 and FIG. 11 show the relationship among the value of x or the Mn content in atomic percent, spin polarization P, and B2 regulation temperature Tc of the above-mentioned CoMnSi alloy.

TABLE 3

| Mn content (atomic %) | Spin polarization P | B2 regulation temperature Tc (° C.) |
|---|---|---|
| 21 | 0.1 | 360 |
| 25 | 0.5 | 320 |
| 30 | 0.7 | 290 |
| 35 | 0.8 | 285 |
| 40 | 0.9 | 270 |

As shown in Table 3 and FIG. 11, for a CoMnSi alloy of stoichiometric composition wherein the Mn content is 25 atomic percent, the spin polarization is 0.5 where the alloy has a lattice constant of 2.8 Å and the B2 structure. This value is only 1.25 times the value of spin polarization of a CoFe alloy, which is 0.4. However, as can be seen from Table 3 and FIG. 11, in a CoMnSi alloy having a lattice constant of 2.8 Å and the B2 structure, making the Mn content higher than 25 atomic percent while fixing the Co content to 50 atomic percent leads to a higher spin polarization than that obtained in the case where the Mn content is 25 atomic percent. Therefore, according to the embodiment, the Mn content of the CoMnSi alloy forming the Heusler alloy layers 332 and 52 is made higher than 25 atomic percent, so that it is possible to make the MR ratio of the MR element 5 higher, compared with a case in which a CoMnSi alloy of stoichiometric composition is used for the pinned layer 23 and the free layer 25.

Furthermore, as shown in Table 3 and FIG. 11, in the range in which the Mn content is 21 to 40 atomic percent inclusive, the B2 regulation temperature Tc of the CoMnSi alloy decreases as the Mn content of the CoMnSi alloy increases. When the Mn content is 30 atomic percent or higher, the B2 regulation temperature Tc is 300° C. or lower. If the B2 regulation temperature Tc exceeds 300° C., there is a possibility that, when heat treatment is performed on the Heusler alloy layers 332 and 52, growth of crystal grains occurs and large grains are produced in the first shield layer 3, and the permittivity of the first shield layer 3 is thereby reduced. Therefore, it is preferred that the B2 regulation temperature Tc be 300° C. or lower in practice. To achieve this, it is preferred that the Mn content be 30 atomic percent or higher, that is, x be 30 or greater.

Furthermore, another experiment was performed to find out that the Curie temperature of a CoMnSi alloy decreases as the Mn content of the CoMnSi alloy increases. Considering the practicality of the thin-film magnetic head, it is preferred that the Curie temperature of the Heusler alloy layers 332 and 52 made of a CoMnSi alloy be 200° C. or higher. From the experiment, it was found out that a Curie temperature of 200° C. or higher is obtainable for the CoMnSi alloy by making the Mn content 40 atomic percent or lower. Therefore, to make the Curie temperature of the CoMnSi alloy 200° C. or higher, it is preferred that the Mn content be 40 atomic percent or lower, that is, x be 40 or smaller.

Description will now be made of functions of the middle magnetic layer 333 disposed between the Heusler alloy layer 332 and the nonmagnetic conductive layer 24, and the underlying magnetic layer 51 disposed between the Heusler alloy layer 52 and the nonmagnetic conductive layer 24. If the magnetic layers 333 and 51 are not provided, the Heusler alloy layer 332 and 52 touch the nonmagnetic conductive layer 24. According to electron state calculation using a program of first-principles calculation, it was found out that the spin polarization at the interface of the Heusler alloy layer 332 with respect to the middle magnetic layer 333 and the spin polarization at the interface of the Heusler alloy layer 52 with respect to the underlying magnetic layer 51 are each higher than the spin polarization at the interface of each of the Heusler alloy layers 332 and 52 with respect to the nonmagnetic conductive layer 24 in the case in which the Heusler alloy layers 332 and 52 touch the nonmagnetic conductive layer 24. Results of the electronic state calculation which proves this finding will now be described.

Here are given the results of the electronic state calculation performed for the following first to third examples. In the first example a CoMnSi alloy layer touches a Cu layer. In the second example a CoMnSi alloy layer touches a CoFe alloy layer containing 70 atomic percent Co and 30 atomic percent Fe. In the third example a CoMnSi alloy layer touches an Fe layer. In these first to third examples, the CoMnSi alloy layer corresponds to the Heusler alloy layer 332 or 52, the Cu layer corresponds to the nonmagnetic conductive layer 24, and the CoFe alloy layer and the Fe layer correspond to the magnetic layers 333 and 51. In any of these examples, the CoMnSi alloy layer was assumed as containing 50 atomic percent Co, 35 atomic percent Mn and 15 atomic percent Si and having the B2 structure. The KKR method mentioned previously was used as the method of first-principles calculation. Furthermore, for the CoMnSi alloy layer, used was a model in which the lattice constant was fixed to 2.8 Å, Co atoms were placed at body-centered positions of unit cells, and Mn atoms and Si atoms in the proportion predetermined as above were randomly arranged.

In the first example, the density of states of the upward spin and that of the downward spin at the Fermi level were obtained by electronic state calculation for each of Co and Mn at the interface of the CoMnSi alloy layer with respect to the Cu layer. The density of states of the spin of Si is not considered since it hardly contributes to the spin polarization at the interface of the CoMnSi alloy layer with respect to the Cu layer. For the Cu layer, a model was formed by making the crystal structure a face-centered cubic structure and using the lattice constant of Cu having the face-centered cubic structure. Table 4 shows the results of calculation for the first example.

TABLE 4

| | Co | Mn | Total | Polarization P |
|---|---|---|---|---|
| Density of states of upward spin | 5.98 | 5.30 | 11.28 | 0.13 |
| Density of states of downward spin | 6.00 | 2.70 | 8.70 | |

Table 4 also shows the total of density of states of the upward spin of Co and density of states of the upward spin of Mn at the Fermi level, the total of density of states of the downward spin of Co and density of states of the downward spin of Mn at the Fermi level, and the spin polarization P at the interface obtained based on these totals. The polarization P can be obtained by the equation below where the total of density of states of the upward spin of Co and density of states of the upward spin of Mn at the Fermi level is indicated as [UP-DOS], and the total of density of states of the downward spin of Co and density of states of the downward spin of Mn at the Fermi level is indicated as [DOWN-DOS].

$$P=([UP\text{-}DOS]-[DOWN\text{-}DOS])/([UP\text{-}DOS]+[DOWN\text{-}DOS])$$

In the second example, the density of states of the upward spin and that of the downward spin at the Fermi level were obtained by electronic state calculation for each of Co and Mn at the interface of the CoMnSi alloy layer with respect to the CoFe alloy layer. The density of states of the spin of Si is not considered since it hardly contributes to the spin polarization at the interface of the CoMnSi alloy layer with respect to the CoFe alloy layer. For the CoFe alloy layer, a model was fabricated by making the crystal structure a body-centered cubic structure and using the lattice constant of CoFe alloy having the body-centered cubic structure. Table 5 below shows the results of calculation for the second example. As does Table 4, Table 5 also shows the total of density of states of the upward spin of Co and density of states of the upward spin of Mn at the Fermi level, the total of density of states of the downward spin of Co and density of states of the downward spin of Mn at the Fermi level, and the spin polarization P at the interface obtained based on these totals.

TABLE 5

| | Co | Mn | Total | Polarization P |
|---|---|---|---|---|
| Density of states of upward spin | 5.10 | 11.00 | 16.10 | 0.54 |
| Density of states of downward spin | 3.20 | 1.64 | 4.84 | |

In the third example, the density of states of the upward spin and that of the downward spin at the Fermi level were obtained by electronic state calculation for each of Co and Mn at the interface of the CoMnSi alloy layer with respect to the Fe layer. The density of states of the spin of Si is not considered since it hardly contributes to the spin polarization at the interface of the CoMnSi alloy layer with respect to the Fe layer. For the Fe layer, a model was fabricated by making the crystal structure a body-centered cubic structure and using the lattice constant of Fe having the body-centered cubic structure. Table 6 below shows the results of calculation for the third example. As does Table 4, Table 6 also shows the total of density of states of the upward spin of Co and density of states of the upward spin of Mn at the Fermi level, the total of density of states of the downward spin of Co and density of states of the downward spin of Mn at the Fermi level, and the spin polarization P at the interface obtained based on these totals.

TABLE 6

| | Co | Mn | Total | Polarization P |
|---|---|---|---|---|
| Density of states of upward spin | 5.35 | 13.35 | 18.70 | 0.76 |
| Density of states of downward spin | 1.33 | 1.17 | 2.50 | |

As shown in Table 4, the spin polarization P at the interface of the CoMnSi alloy layer with respect to the Cu layer is as low as 0.13. In contrast, as shown in Table 5, the spin polarization P at the interface of the CoMnSi alloy layer with respect to the CoFe alloy layer is as high as 0.54, and, as shown in Table 6, the spin polarization P at the interface of the CoMnSi alloy layer with respect to the Fe layer is 0.76 which is also a great value. As indicated by this result, the spin polarization at the interface of the Heusler alloy layer 332 with respect to the middle magnetic layer 333 and the spin polarization at the interface of the Heusler alloy layer 52 with respect to the underlying magnetic layer 51 are each higher than the spin polarization at the interface of each of the Heusler alloy layers 332 and 52 with respect to the nonmagnetic conductive layer 24 in the case in which the Heusler alloy layers 332 and 52 touch the nonmagnetic conductive layer 24. Therefore, by providing the magnetic layers 333 and 51, it is possible to make the MR ratio of the MR element 5 higher, compared with the case in which the magnetic layers 333 and 51 are not provided and the Heusler alloy layers 332 and 52 touch the nonmagnetic conductive layer 24.

For each of the middle magnetic layer 333 and the underlying magnetic layer 51, it is possible to make the spin polarization at the above-mentioned interface sufficiently high by using Fe or a CoFe alloy containing 30 to 100 atomic percent Fe as the material of these layers.

However, with regard to the underlying magnetic layer 51 included in the free layer 25, magnetostriction and coercivity of the underlying magnetic layer 51 increase if the Fe content of the underlying magnetic layer 51 exceeds 30 atomic percent. It is therefore preferred that the material of the underlying magnetic layer 51 be a CoFe alloy containing 30 atomic percent Fe by way of example.

As described so far, in the MR element 5 of the embodiment, the pinned layer 23 includes the underlying magnetic layer 331 made of a magnetic alloy layer having the body-centered cubic structure, and the Heusler alloy layer 332 formed on the underlying magnetic layer 331. Similarly, the free layer 25 includes the underlying magnetic layer 51 made of a magnetic alloy layer having the body-centered cubic structure, and the Heusler alloy layer 52 formed on the underlying magnetic layer 51. Each of the Heusler alloy layers 332 and 52 is made of a CoMnSi alloy wherein the Mn content is higher than 25 atomic percent and equal to or lower than 40 atomic percent, and contains the principal component having the B2 structure in which Co atoms are placed at body-centered positions of unit cells and Mn atoms or Si atoms are randomly placed at vertexes of the unit cells. The spin polarization of each of the Heusler alloy layers 332 and 52 is higher than the spin polarization of an alloy layer made of a CoMnSi alloy wherein Co, Mn and Si are in the proportion of 2:1:1 in the case where such an alloy layer is formed on the underlying magnetic layer. As a result, according to the MR element 5 and the thin-film magnetic head of the embodiment, it is possible to increase the MR ratio of the MR element 5 to which a sense current is fed in a direction intersecting the plane of each layer making up the MR element 5.

According to the embodiment, by making the value of 'x' 40 or smaller, it is possible to make the Curie temperature of each of the Heusler alloy layers 332 and 52 fall within a practical range of 200° C. or higher. Furthermore, by making the value of 'x' 30 or greater, it is possible to make the B2 regulation temperature Tc of each of the Heusler alloy layers 332 and 52 fall within a practical range of 300° C. or lower.

In the embodiment, the middle magnetic layer 333 is provided between the Heusler alloy layer 332 and the nonmagnetic conductive layer 24, and the underlying magnetic layer 51 is provided between the Heusler alloy layer 52 and the nonmagnetic conductive layer 24. The spin polarization at the interface of the Heusler alloy layer 332 with respect to the middle magnetic layer 333 and the spin polarization at the interface of the Heusler alloy layer 52 with respect to the underlying magnetic layer 51 are each higher than the spin polarization at the interface of each of the Heusler alloy layers 332 and 52 with respect to the nonmagnetic conductive layer 24 in the case in which the Heusler alloy layers 332 and 52 touch the nonmagnetic conductive layer 24. Therefore, according to the embodiment, it is possible to make the MR ratio of the MR element 5 higher, compared with the case in which the magnetic layers 333 and 51 are not provided and the Heusler alloy layers 332 and 52 touch the nonmagnetic conductive layer 24.

In the embodiment, each of the pinned layer 23 and the free layer 25 includes the underlying magnetic layer made of a magnetic alloy layer having the body-centered cubic structure, and the Heusler alloy layer that is formed on the underlying magnetic layer and that has the composition defined in the embodiment. However, only one of the pinned layer 23 and the free layer 25 may include these underlying magnetic layer and Heusler alloy layer. The above-described effects are achieved in this case, too.

Figure 4:
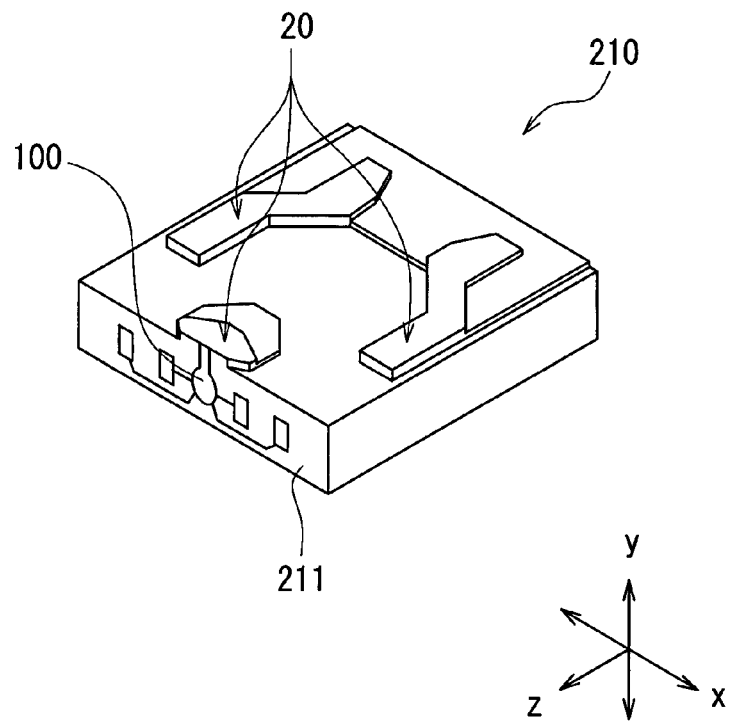
FIG. 4 is a perspective view illustrating a slider incorporated in a head gimbal assembly of the first embodiment of the invention.

A head gimbal assembly, a head arm assembly and a magnetic disk drive of the embodiment will now be described. Reference is made to FIG. 4 to describe a slider 210 incorporated in the head gimbal assembly. In the magnetic disk drive the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 2. The base body 211 is nearly hexahedron-shaped. One of the six surfaces of the base body 211 faces toward the magnetic disk platter. The medium facing surface 20 is formed in this one of the surfaces. When the magnetic disk platter rotates in the z direction of FIG. 4, an airflow passes between the magnetic disk platter and the slider 210, and a lift is thereby generated below the slider 210 in the y direction of FIG. 4 and exerted on the slider 210. The slider 210 flies over the magnetic disk platter by means of the lift. The x direction of FIG. 4 is across the tracks of the magnetic disk platter. A thin-film magnetic head 100 of the embodiment is formed near the air-outflow-side end (the end located at the lower left of FIG. 4) of the slider 210.

Figure 5:
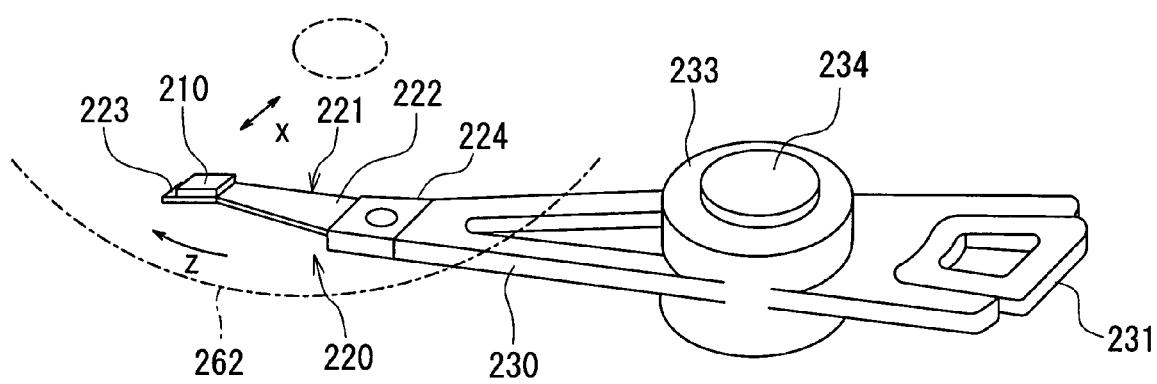
FIG. 5 is a perspective view illustrating a head arm assembly of the first embodiment of the invention.

Reference is now made to FIG. 5 to describe the head gimbal assembly 220 of the embodiment. The head gimbal assembly 220 incorporates the slider 210 and a suspension 221 that flexibly supports the slider 210. The suspension 221 incorporates: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator incorporates the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly comprising the arm 230 and the head gimbal assembly 220 attached to the arm 230 is called a head arm assembly. An assembly comprising a carriage having a plurality of arms wherein the head gimbal assembly 220 is attached to each of the arms is called a head stack assembly.

FIG. 5 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to an axis 234 that rotatably supports the arm 230.

Figure 6:
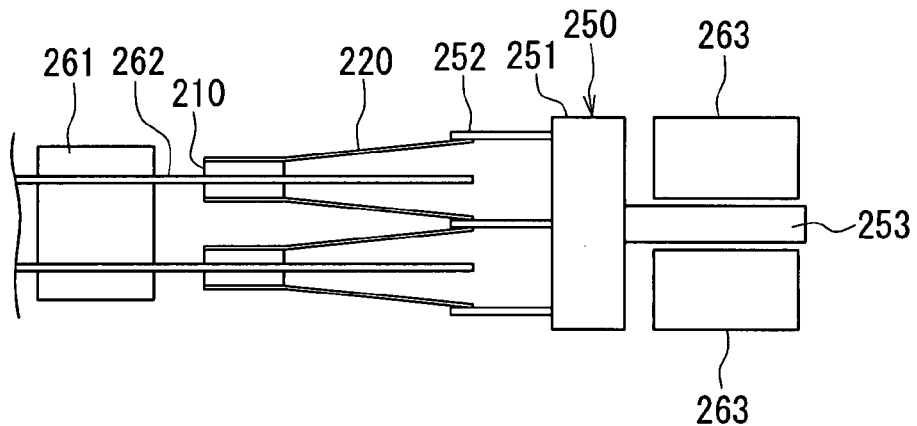
FIG. 6 is a view for illustrating the main part of a magnetic disk drive of the first embodiment of the invention.
Figure 7:
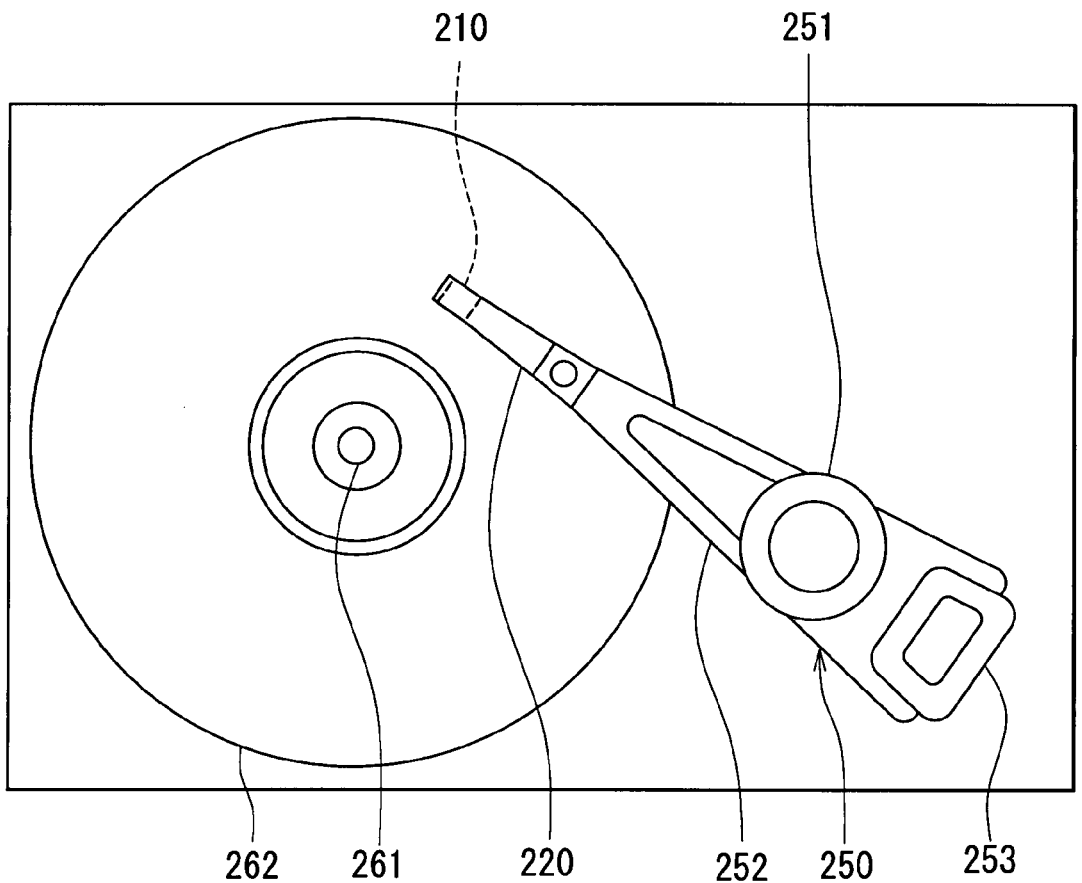
FIG. 7 is a top view of the magnetic disk drive of the first embodiment of the invention.

Reference is now made to FIG. 6 and FIG. 7 to describe an example of the head stack assembly and the magnetic disk drive of the embodiment. FIG. 6 illustrates the main part of the magnetic disk drive. FIG. 7 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention and support the sliders 210 and align them with respect to the magnetic disk platters 262.

In the magnetic disk drive of the embodiment the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 through the use of the write head and reads data stored on the magnetic disk platter 262 through the use of the read head.

The head gimbal assembly, the head arm assembly and the magnetic disk drive of the embodiment exhibit effects similar to those of the foregoing thin-film magnetic head of the embodiment.

Second Embodiment

Figure 12:
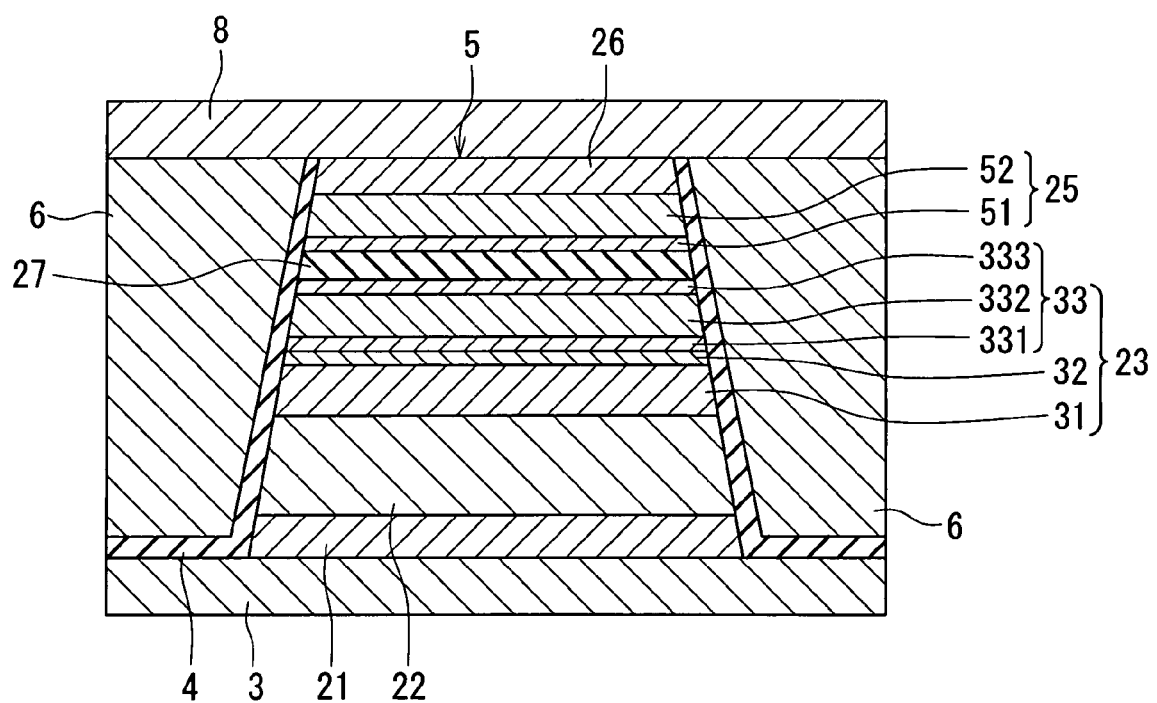
FIG. 12 is a cross-sectional view of a read head of a second embodiment of the invention, wherein the cross section is parallel to the medium facing surface.

A second embodiment of the invention will now be described. FIG. 12 is a cross-sectional view of a read head of the second embodiment, wherein the cross section is parallel to the medium facing surface. As shown in FIG. 12, the MR element 5 of the second embodiment has such a configuration that a tunnel barrier layer 27 made of a nonmagnetic insulating layer is provided in place of the nonmagnetic conductive layer 24 of the first embodiment. That is, the MR element 5 of the second embodiment is a TMR element. The tunnel barrier layer 27 is such a layer that electrons are allowed to pass therethrough while maintaining the spin by the tunnel effect. The tunnel barrier layer 27 has a thickness of 0.5 to 2 nm, for example. The tunnel barrier layer 27 may be made of nitride or oxide of Al, Ni, Gd, Mg, Ta, Mo, Ti, W, Hf or Zr, for example. The tunnel barrier layer 27 corresponds to the nonmagnetic layer of the invention. In the second embodiment, as in the first embodiment, a sense current is fed to the MR element 5 in a direction intersecting the plane of each layer making up the MR element 5, such as the direction perpendicular to the plane of each layer making up the MR element 5.

In the second embodiment, as in the first embodiment, it is possible to increase the MR ratio of the MR element 5 that is a TMR element since the spin polarization of the Heusler alloy layers 332 and 52 is high.

In the second embodiment, the middle magnetic layer 333 is provided between the Heusler alloy layer 332 and the tunnel barrier layer 27, and the underlying magnetic layer 51 is provided between the Heusler alloy layer 52 and the tunnel barrier layer 27. As a result, it is possible to prevent a reduction in spin polarization of the Heusler alloy layers 332 and 52 resulting from oxygen elements transferred from the tunnel barrier layer 27 toward the Heusler alloy layers 332 and 52, and to thereby prevent a reduction in MR ratio of the MR element 5.

The remainder of configuration, function and effects of the second embodiment are similar to those of the first embodiment.

The present invention is not limited to the foregoing embodiments but may be practiced in still other ways. In the invention, for example, the pinned layer 23 is not limited to a synthetic pinned layer.

While the thin-film magnetic head disclosed in the embodiments has such a configuration that the read head is formed on the base body and the write head is stacked on the read head, it is also possible that the read head is stacked on the write head.

If the thin-film magnetic head is dedicated to reading, the thin-film magnetic head may have a configuration incorporating a read head only.

The magnetoresistive element of the invention can be used not only for a read head of a thin-film magnetic head but also for other applications such as a magnetic sensor.

Obviously many modifications and variations of the present invention are possible in the light of the above teachings. It is therefore to be understood that within the scope of the appended claims the invention may be practiced otherwise than as specifically described.

What is claimed is:

1. A magnetoresistive element comprising:
a nonmagnetic layer having a first surface and a second surface that face toward opposite directions;
a pinned layer disposed adjacent to the first surface of the nonmagnetic layer, a direction of magnetization in the pinned layer being fixed, and
a free layer disposed adjacent to the second surface of the nonmagnetic layer, a direction of magnetization in the free layer changing in response to an external magnetic field,
wherein a current for detecting magnetic signals is fed in a direction intersecting a plane of each of the foregoing layers, and wherein:
of the pinned layer and the free layer, at least the pinned layer includes an underlying magnetic layer made of a magnetic alloy layer having a body-centered cubic structure, and a Heusler alloy layer formed on the underlying magnetic layer;
the Heusler alloy layer is made of a CoMnSi alloy having an Mn content higher than 25 atomic percent and lower than or equal to 40 atomic percent, and the Heusler alloy layer contains a principal component having a B2 structure in which Co atoms are placed at body-centered positions of unit cells and Mn atoms or Si atoms are randomly placed at vertexes of the unit cells;
the Heusler alloy layer that the pinned layer includes is disposed between the underlying magnetic layer that the pinned layer includes and the nonmagnetic layer;
the pinned layer further includes a middle magnetic layer disposed between the Heusler alloy layer that the pinned layer includes and the nonmagnetic layer; and
the middle magnetic layer contains 'z' atomic percent Fe and (100−z) atomic percent Co, where z is within a range of 30 to 100 inclusive.

2. The magnetoresistive element according to claim 1, wherein the CoMnSi alloy has a Co content within a range of 48 to 52 atomic percent inclusive.

3. The magnetoresistive element according to claim 1, wherein the Mn content of the CoMnSi alloy is within a range of 30 to 40 atomic percent inclusive.

4. The magnetoresistive element according to claim 1, wherein the underlying magnetic layer contains 'y' atomic percent Fe and (100−y) atomic percent Co, where y is within a range of 30 to 100 inclusive.

5. The magnetoresistive element according to claim 1, wherein:
the pinned layer further includes: a nonmagnetic middle layer disposed at such a location that the underlying magnetic layer that the pinned layer includes is sandwiched between the nonmagnetic middle layer and the Heusler alloy layer that the pinned layer includes; and a ferromagnetic layer disposed at such a location that the nonmagnetic middle layer is sandwiched between the ferromagnetic layer and the underlying magnetic layer that the pinned layer includes, a direction of magnetization in the ferromagnetic layer being fixed; and
a direction of magnetization in each of the underlying magnetic layer, the Heusler alloy layer and the middle magnetic layer that the pinned layer includes is fixed to a direction opposite to the direction of magnetization in the ferromagnetic layer.

6. The magnetoresistive element according to claim 1, wherein: the free layer includes the underlying magnetic layer and the Heusler alloy layer; and
the underlying magnetic layer that the free layer includes is disposed between the Heusler alloy layer that the free layer includes and the nonmagnetic layer.

7. The magnetoresistive element according to claim 1, wherein the nonmagnetic layer is made of a conductive material.

8. The magnetoresistive element according to claim 1, wherein the nonmagnetic layer is a tunnel barrier layer made of an insulating material.

9. A method of manufacturing the magnetoresistive element according to claim 1, comprising the steps of forming the pinned layer, the nonmagnetic layer and the free layer, respectively, wherein the step of forming the pinned layer includes forming the underlying magnetic layer that the pinned layer includes, the Heusler alloy layer that the pinned layer includes, and the middle magnetic layer in this order.

10. The method according to claim 9, further comprising the step of performing heat treatment on the Heusler alloy layer to make a crystal structure of the principal component of the Heusler alloy layer the B2 structure.

11. A thin-film magnetic head comprising: a medium facing surface that faces toward a recording medium; the magnetoresistive element according to claim 1 disposed near the medium facing surface to detect a signal magnetic field sent from the recording medium; and a pair of electrodes for feeding a current for detecting magnetic signals to the magnetoresistive element in a direction intersecting a plane of each layer making up the magnetoresistive element.

12. A head gimbal assembly comprising: a slider including the thin-film magnetic head according to claim 11 and disposed to face toward a recording medium; and a suspension flexibly supporting the slider.

13. A head arm assembly comprising: a slider including the thin-film magnetic head according to claim 11 and disposed to face toward a recording medium; a suspension flexibly supporting the slider; and an arm for making the slider travel across tracks of the recording medium, the suspension being attached to the arm.

14. A magnetic disk drive comprising: a slider including the thin-film magnetic head according to claim 11 and disposed to face toward a recording medium that is driven to rotate; and an alignment device supporting the slider and aligning the slider with respect to the recording medium.

* * * * *